United States Patent
Hibino (10) Patent No.: US 9,153,768 B2
(45) Date of Patent: Oct. 6, 2015

(54) PIEZOELECTRIC/ELECTROSTRICTIVE CERAMICS COMPOSITION AND DISPLACEMENT GENERATING DEVICE

(71) Applicant: NGK Insulators, Ltd., Nagoya-Shi (JP)

(72) Inventor: Tomohiko Hibino, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 15 days.

(21) Appl. No.: 14/189,023

(22) Filed: Feb. 25, 2014

(65) Prior Publication Data

US 2014/0167562 A1 Jun. 19, 2014

Related U.S. Application Data (63) Continuation of application No. PCT/JP2013/066959, filed on Jun. 20, 2013.

(30) Foreign Application Priority Data

Jun. 21, 2012 (JP) ................................. 2012-139428

(51) Int. Cl.
*H01L 41/083* (2006.01)
*H01L 41/187* (2006.01)
(Continued)

(52) U.S. Cl.
CPC .......... *H01L 41/1876* (2013.01); *C04B 35/493* (2013.01); *C04B 35/62645* (2013.01);
(Continued)

(58) Field of Classification Search
CPC ............ C04B 35/493; C04B 35/62645; H01L 41/0926; H01L 41/1876; H01L 41/43

USPC .......... 310/328, 332, 358, 311, 367; 252/62.9 PZ
IPC ..................... H01L 41/083, 41/187; H02N 2/00
See application file for complete search history.

(56) References Cited

U.S. PATENT DOCUMENTS

| 7,494,602 B2 * | 2/2009 | Liufu ..................... 252/62.9 PZ |
| 2007/0046152 A1 * | 3/2007 | Ifuku et al. .................... 310/358 |
| 2009/0236946 A1 | 9/2009 | Yura et al. |

FOREIGN PATENT DOCUMENTS

| JP | 53-44040 | 11/1978 |
| JP | 2000-253676 | 9/2000 |

(Continued)

OTHER PUBLICATIONS

International Search Report (Application No. PCT/JP2013/066959) dated Sep. 10, 2013.

(Continued)

*Primary Examiner* — Thomas Dougherty
*Assistant Examiner* — Karen B Addison
(74) *Attorney, Agent, or Firm* — Burr & Brown, PLLC (57) ABSTRACT

Provided is piezoelectric/electrostrictive body generating large electric-field-induced strain, and having high durability with respect to an electric field having a direction opposite to a polarization direction. A composition of piezoelectric/electrostrictive ceramics is represented by a general formula $Pb_a\{Zn_bSb_c(Zr_dTi_{1-d})_{1-b-c}\}O_3$. As for a, b, c, and d, $0.985 \leq a \leq 0.998$, $0.010 \leq b \leq 0.040$, $0.025 \leq c \leq 0.090$, $0.460 \leq d \leq 0.510$, and $2.125 \leq c/b \leq 3.000$ are satisfied. An accessory component containing at least one element selected from the group consisting of Mn, Cr, Fe, and a rare-earth element may be added to a main component. An additive amount of the at least one element relative to 100 parts by weight of the main component is 0.3 parts by weight or less in terms of an oxide.

6 Claims, 4 Drawing Sheets

(51) Int. Cl.
*C04B 35/493* (2006.01)
*H01L 41/09* (2006.01)
*C04B 35/626* (2006.01)
*H01L 41/43* (2013.01)

(52) U.S. Cl.
CPC .......... *H01L41/083* (2013.01); *H01L 41/0926* (2013.01); *C04B 2235/3224* (2013.01); *C04B 2235/3241* (2013.01); *C04B 2235/3251* (2013.01); *C04B 2235/3262* (2013.01); *C04B 2235/3272* (2013.01); *C04B 2235/3284* (2013.01); *C04B 2235/3294* (2013.01); *C04B 2235/768* (2013.01); *C04B 2235/85* (2013.01); *H01L 41/43* (2013.01)

(56) References Cited

FOREIGN PATENT DOCUMENTS

| | | |
|---|---|---|
| JP | 2004-115346 | 4/2004 |
| JP | 2009-007197 | 1/2009 |
| JP | 2010-153404 | 7/2010 |

OTHER PUBLICATIONS

International Preliminary Report on Patentability dated Dec. 31, 2014 (with English translation).

* cited by examiner

PIEZOELECTRIC/ELECTROSTRICTIVE CERAMICS COMPOSITION AND DISPLACEMENT GENERATING DEVICE

TECHNICAL FIELD

The present invention relates to a piezoelectric/electrostrictive ceramics composition and a displacement generating device.

BACKGROUND ART

As for piezoelectric/electrostrictive ceramics for an actuator, lead zirconate titanate (PZT) is used in many cases. A ratio of titanium (Ti)/zirconium (Zr) in PZT is adjusted in the vicinity of the morphotropic phase boundary (MPB) in many cases. A third component such as lead niobate zincate (Pb($Zn_{1/3}Nb_{2/3}$)$O_3$) is introduced into PZT in some cases. In addition, Ti and Zr are replaced with a donor element having a higher valence such as niobium (Nb) in some cases. Thus, electric field responsiveness of a domain is improved, and electric-field-induced strain becomes large.

In piezoelectric/electrostrictive ceramics in Patent Document 1, lead antimonate zincate (Pb($Zn_{1/3}Sb_{2/3}$)$O_3$) is introduced to PZT. In piezoelectric/electrostrictive ceramics in Patent Document 2, Pb($Zn_{1/3}Sb_{2/3}$)$O_3$ is introduced to PZT and further modification is performed.

PRIOR ART DOCUMENTS

Patent Documents

Patent Document 1: Japanese Patent No. 0963237
Patent Document 2: Japanese Patent Application Laid-Open No. 2000-253676

SUMMARY OF INVENTION

Problems to be Solved by the Invention

In a case where an electric field having a direction opposite to a polarization direction and having an absolute value greater than a coercive electric field is applied to the piezoelectric/electrostrictive ceramics, depolarization occurs. Therefore, in the case where the electric field having the direction opposite to the polarization direction is applied to the piezoelectric/electrostrictive ceramics, the absolute value of the electric field is limited to be equal to or less than the coercive electric field. However, even in the case where the absolute value of the electric field is equal to or less than the coercive electric field, electric-field-induced strain becomes smaller with time, depending on the piezoelectric/electrostrictive ceramics. In a case where the piezoelectric/electrostrictive ceramics having a high coercive electric field is selected, durability with respect to the electric field having the direction opposite to the polarization direction is improved, but the electric-field-induced strain becomes small.

The present invention has been made to solve this problem. An object of the present invention is to provide a piezoelectric/electrostrictive ceramics which generates large electric-field-induced strain, and has high durability with respect to an electric field having a direction opposite to a polarization direction.

In addition, another object of the present invention is to provide a displacement generating device which can generate large displacement, use electric-field-induced strain provided when the electric field having the direction opposite to the polarization direction is applied, and have high durability.

Means for Solving the Problems

First and second aspects of the present invention are directed to a piezoelectric/electrostrictive ceramics composition.

The piezoelectric/electrostrictive ceramics composition according to the first aspect of the present invention is represented by a general formula $Pb_a\{Zn_bSb_c(Zr_dTi_{1-d})_{1-b-c}\}O_3$. Herein, a, b, c, and d satisfy $0.985 \leq a \leq 0.998$, $0.010 \leq b \leq 0.040$, $0.025 \leq c \leq 0.090$, $0.460 \leq d \leq 0.510$, and $2.125 \leq c/b \leq 3.000$.

In the piezoelectric/electrostrictive ceramics composition according to the second aspect of the present invention, an accessory component containing at least one element selected from the group consisting of Mn, Cr, Fe, and a rare-earth element R is added to a main component represented by a general formula $Pb_a\{Zn_bSb_c(Zr_dTi_{1-d})_{1-b-c}\}O_3$ in which a, b, c, and d satisfy $0.985 \leq a \leq 0.998$, $0.010 \leq b \leq 0.040$, $0.025 \leq c \leq 0.090$, $0.460 \leq d \leq 0.510$, and $2.125 \leq c/b \leq 3.000$.

In a case where an additive amount of Mn is expressed in terms of MnO, an additive amount of Cr is expressed in terms of $Cr_2O_3$, an additive amount of Fe is expressed in terms of $Fe_2O_3$, and an additive amount of the rare-earth element R is expressed in terms of $R_2O_3$, an additive amount of the at least one element relative to 100 parts by weight of the main component is 0.3 parts by weight or less.

Third and fourth aspects of the present invention are directed to a displacement generating device.

According to the third aspect of the present invention, an actuator and a drive circuit are provided. The actuator includes a first electrode, a piezoelectric/electrostrictive body, and a second electrode. The piezoelectric/electrostrictive body is made of the piezoelectric/electrostrictive ceramics composition according to the first or second aspect. The first electrode and the second electrode are opposed across the piezoelectric/electrostrictive body. A polarization direction of the piezoelectric/electrostrictive body is a direction from the first electrode toward the second electrode. The drive circuit applies a drive signal between the first electrode and the second electrode. The drive signal is an AC voltage, or a DC voltage in which the first electrode serves as a negative electrode and the second electrode serves as a positive electrode.

According to the fourth aspect of the present invention, an actuator and a drive circuit are provided. The actuator includes a first electrode, a first piezoelectric/electrostrictive body, a second electrode, a second piezoelectric/electrostrictive body, and a third electrode. The first piezoelectric/electrostrictive body and the second piezoelectric/electrostrictive body are made of the piezoelectric/electrostrictive ceramics composition according to the first or second aspect. The first electrode and the second electrode are opposed across the first piezoelectric/electrostrictive body. The second electrode and the third electrode are opposed across the second piezoelectric/electrostrictive body. A polarization direction of the first piezoelectric/electrostrictive body is a direction from the first electrode toward the second electrode. A polarization direction of the second piezoelectric/electrostrictive body is a direction from the second electrode toward the third electrode. The actuator is a bimorph-type. The first electrode and the third electrode each serve as one drive electrode. The second electrode serves as the other drive electrode. The drive circuit applies a drive signal between one drive electrode and the other drive electrode.

Effects of the Invention

According to the first and second aspects of the present invention, it is possible to provide a piezoelectric/electrostrictive ceramics which generates large electric-field-induced strain, and has high durability with respect to an electric field having a direction opposite to a polarization direction.

According to the third and fourth aspects of the present invention, it is possible to provide a displacement generating device which can generate large displacement, use electric-field-induced strain provided when the electric field having the direction opposite to the polarization direction is applied, and have high durability.

These and other objects, features, aspects, and advantages of the present invention will become more apparent from the following detailed description of the present invention when taken in conjunction with the accompanying drawings.

DESCRIPTION OF EMBODIMENTS

First Embodiment

A first embodiment relates to a piezoelectric/electrostrictive ceramics.

(Use Application)

Figure 1:
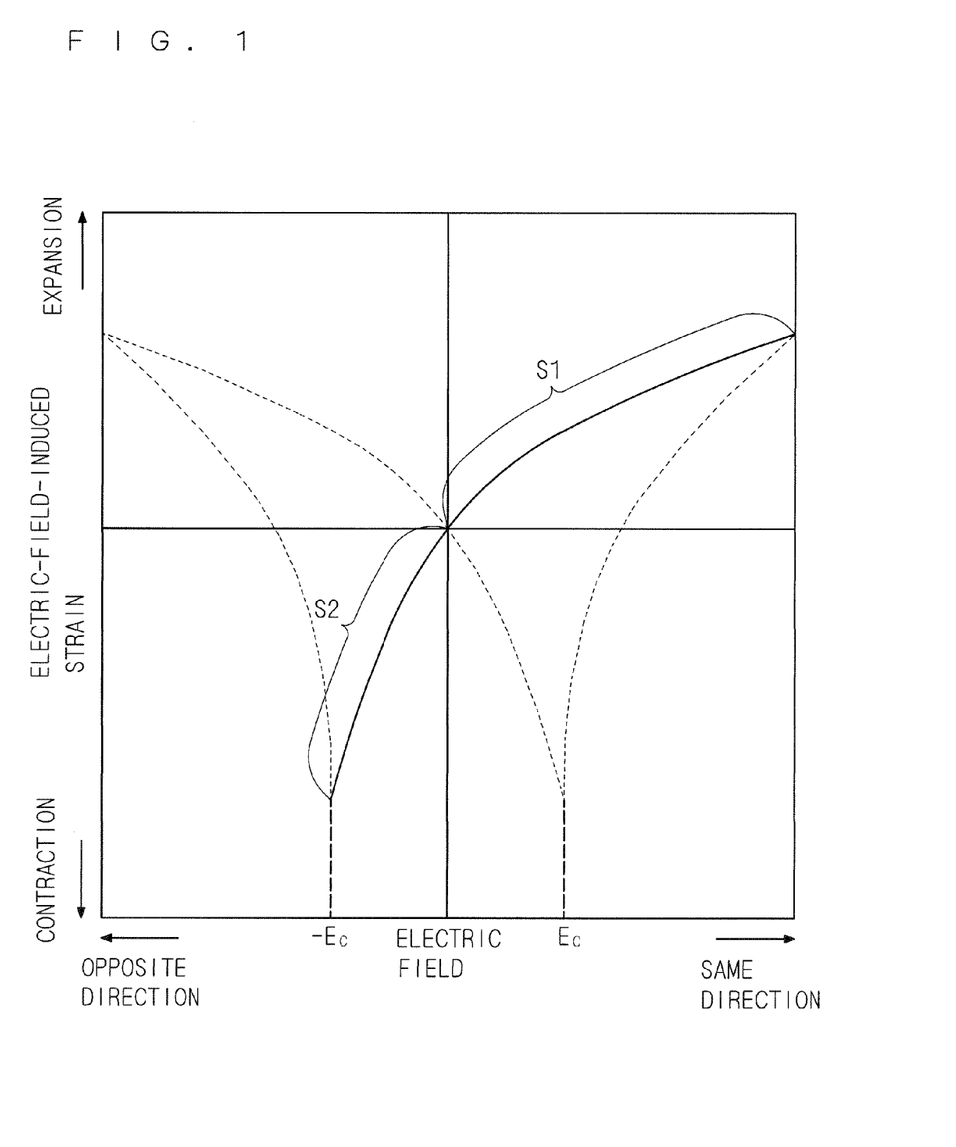
FIG. 1 is a graph showing a relationship between an electric field and electric-field-induced strain.

A graph in FIG. 1 shows a relationship between an electric field and electric-field-induced strain. A horizontal axis in FIG. 1 shows the electric field applied to the piezoelectric/electrostrictive ceramics. In a case where a sign of the electric field is positive, an electric field having the same direction as a polarization direction is applied to the piezoelectric/electrostrictive ceramics. In a case where the sign of the electric field is negative, an electric field having a direction opposite to the polarization direction is applied to the piezoelectric/electrostrictive ceramics. A vertical axis in FIG. 1 shows the electric-field-induced strain of the piezoelectric/electrostrictive ceramics. In a case where a sign of the electric-field-induced strain is positive, the piezoelectric/electrostrictive ceramics expands in a direction parallel to the polarization direction. In a case where the sign of the electric-field-induced strain is negative, the piezoelectric/electrostrictive ceramics contracts in the direction parallel to the polarization direction.

As shown by a section S1 in FIG. 1, in the case where the electric field having the same direction as the polarization direction is applied to the piezoelectric/electrostrictive ceramics, depolarization does not occur when an electric field having an absolute value greater than a coercive electric field $E_C$ is applied to the piezoelectric/electrostrictive ceramics. Therefore, in the case where the electric field having the same direction as the polarization direction is applied to the piezoelectric/electrostrictive ceramics, the electric field having the absolute value greater than the coercive electric field $E_C$ may be applied to the piezoelectric/electrostrictive ceramics.

In the case where the electric field having the direction opposite to the polarization direction is applied to the piezoelectric/electrostrictive ceramics, the depolarization occurs when the electric field having the absolute value greater than the coercive electric field $E_C$ is applied to the piezoelectric/electrostrictive ceramics beyond a section S2 in FIG. 1. Therefore, as shown by the section S2 in FIG. 1, in the case where the electric field having the direction opposite to the polarization direction is applied to the piezoelectric/electrostrictive ceramics, the absolute value of the electric field is limited to be equal to or less than the coercive electric field $E_C$. However, even in the case where the absolute value of the electric field is equal to or less than the coercive electric field $E_C$, the electric-field-induced strain becomes smaller with time, depending on the piezoelectric/electrostrictive ceramics.

The piezoelectric/electrostrictive ceramics of the first embodiment is high in durability with respect to the electric field having the direction opposite to the polarization direction, so that the electric-field-induced strain is maintained even when the electric field having the direction opposite to the polarization direction is applied. Therefore, the piezoelectric/electrostrictive ceramics of the first embodiment is desirably used for a product to which the electric field having the direction opposite to the polarization direction is applied. However, the piezoelectric/electrostrictive ceramics of the first embodiment may be used for a product to which the electric field having the same direction as the polarization direction is exclusively applied. The piezoelectric/electrostrictive ceramics of the first embodiment is desirably used for an actuator. However, the piezoelectric/electrostrictive ceramics of the first embodiment may be used for a product other than the actuator. For example, the piezoelectric/electrostrictive ceramics of the first embodiment may be used for a transformer, sensor, buzzer, speaker, and the like.

(Composition)

A composition of the piezoelectric/electrostrictive ceramics is represented by a general formula $Pb_a\{Zn_b Sb_c (Zr_d Ti_{1-d})_{1-b-c}\}O_3$. As for a, b, c, and d, $0.985 \leq a \leq 0.998$, $0.010 \leq b \leq 0.040$, $0.025 \leq c \leq 0.090$, $0.460 \leq d \leq 0.510$, and $2.125 \leq c/b \leq 3.000$ are satisfied. An accessory component containing at least one element (hereinafter, referred to as "additive element") selected from the group consisting of manganese (Mn), chromium (Cr), iron (Fe), and a rare-earth element R may be added to a main component represented by the general formula $Pb_a\{Zn_b Sb_c (Zr_d Ti_{1-d})_{1-b-c}\}O_3$ in which a, b, c, and d satisfy $0.985 \leq a \leq 0.998$, $0.010 \leq b \leq 0.040$, $0.025 \leq c \leq 0.090$, $0.460 \leq d \leq 0.510$, and $2.125 \leq c/b \leq 3.000$. The rare-earth element R is desirably dysprosium (Dy). In a case where an additive amount of Mn is expressed in terms of MnO, an additive amount of Cr is expressed in terms of $Cr_2O_3$, an additive amount of Fe is expressed in terms of $Fe_2O_3$, and an additive amount of the rare-earth element R is expressed in terms of $R_2O_3$, an additive amount of the accessory component is selected such that an additive amount of the additive element relative to 100 parts by weight of the main component is desirably 0.3 parts by weight or less, and more desirably 0.02 parts by weight or more and 0.3 parts by weight or less.

Lead antimonate zincate $(Pb(Zn,Sb)O_3)$ is introduced to lead zirconium titanate $(Pb(Zr,Ti)O_3)$ (PZT). A ratio of an antimony (Sb) amount to a zinc (Zn) amount is selected such that Sb is excessive compared with the stoichiometry. A lead (Pb) amount is selected such that Pb is deficient compared with the stoichiometry.

The piezoelectric/electrostrictive ceramics of the first embodiment is made of a perovskite-type oxide. However, a small amount of a segregated substance other than the perovskite-type oxide is segregated at a grain boundary or the like in some cases. In the case where the accessory component is added to the main component, the accessory component is entirely present as a solid solution in the main component in some cases, the accessory component is segregated without being entirely or partially present as a solid solution in the main component in some cases, or the accessory component is segregated without being entirely present as a solid solution in the main component in some cases.

According to this composition, it is possible to obtain a piezoelectric/electrostrictive ceramics which generates large electric-field-induced strain and has high durability with respect to the electric field having the direction opposite to the polarization direction.

(Third Component)

In a case where a third component (relaxer component) is $Pb(Zn,Sb)O_3$, the durability with respect to the electric field having the direction opposite to the polarization direction is higher than a case where the third component is lead niobate zincate ($Pb(Zn,Nb)O_3$) or lead tantalate zincate ($Pb(Zn,Ta)O_3$).

As shown in Table 1, an ion radius of $Sb^{5+}$ is close to an ion radius of $Ti^{4+}$ and an ion radius of $Zn^{2+}$ is close to an ion radius of $Zr^{4+}$. Meanwhile, an ion radius of $Nb^{5+}$ and an ion radius of $Ta^{5+}$ are in between the ion radius of $Ti^{4+}$ and the ion radius of $Zr^{4+}$.

TABLE 1

Ion species and ion radius

| Ion species | Ion radius (pm) |
|---|---|
| $Sb^{5+}$ | 60 |
| $Ti^{4+}$ | 61 |
| $Nb^{5+}$ | 64 |
| $Ta^{5+}$ | 64 |
| $Zr^{4+}$ | 72 |
| $Zn^{2+}$ | 74 |

The crystalline phase of PZT is tetragonal in the composition on a lead titanate ($PbTiO_3$) side from the morphotropic phase boundary (MPB), and it is rhombohedral in the composition on a lead zirconate ($PbZrO_3$) side from the MPB. The crystalline phase of PZT is in a transitional state in which it is being transformed from a tetragon to a rhombohedron or from a rhombohedron to a tetragon, in the composition in the vicinity of the MPB. Therefore, a domain structure of PZT having the composition in the vicinity of the MPB is likely to become unstable.

In the case where the third component is $Pb(Zn,Nb)O_3$ or $Pb(Zn,Ta)O_3$, not only $Zn^{2+}$ having an ion radius close to the ion radius of $Ti^{4+}$ and the ion radius of $Zr^{4+}$, but also $Nb^{5+}$ or $Ta^{5+}$ having an ion radius in between the ion radius of $Ti^{4+}$ and the ion radius of $Zr^{4+}$ occupies the B site of the perovskite-type oxide, so that the domain structure is more likely to become unstable. In the case where the domain structure becomes unstable, the durability with respect to the electric field having the direction opposite to the polarization direction is reduced.

On the other hand, in the case where when the third component is $Pb(Zn,Sb)O_3$, $Zn^{2+}$ and $Sb^{5+}$ having an ion radius close to the ion radius of $Ti^{4+}$ and the ion radius of $Zr^{4+}$ occupy the B site of the perovskite-type oxide, so that the domain structure becomes stable. In the case where the domain structure becomes stable, the durability with respect to the electric field having the direction opposite to the polarization direction is increased.

A Zn amount b is 0.010 or more and 0.040 or less. An Sb amount c is 0.025 or more and 0.090 or less. In the case where the Zn amount b and the Sb amount c are within these ranges, the electric-field-induced strain becomes large, and the coercive electric field becomes high. In a case where the Zn amount b and the Sb amount c are less than the above ranges, the electric-field-induced strain becomes small. In a case where the Zn amount b and the Sb amount c are more than the above ranges, the coercive electric field becomes low. In a case where the coercive electric field is low, the durability with respect to the electric field having the direction opposite to the polarization direction is reduced. In addition, in the case where the coercive electric field is low, the absolute value of the electric field applied to the direction opposite to the polarization direction needs to be reduced.

(Excess of Sb and Deficiency of Pb)

Sb occupies the B site of the perovskite-type oxide, and functions as a donor.

In a case where Sb is deficient, as shown in a composition formula (1), an oxygen defect Vo is likely to be generated. When the oxygen defect $V_o$ is generated, the electric-field-induced strain becomes small, and the durability with respect to the electric field having the direction opposite to the polarization direction is reduced.

$$Pb(Zn_{1/3}Sb_{(2-x)/3})\{O_{3-x}(V_o)_x\} \quad (1)$$

In a case where Sb is excessive, as shown in a composition formula (2), the oxygen defect Vo is not likely to be generated, and an A-site defect $V_A$ is likely to be generated. In a case where the oxygen defect is not generated, the electric-field-induced strain becomes large. Pb is made deficient for charge compensation to resolve disturbance in charge balance generated due to the excess of Sb.

$$\{Pb_{1-x/2}(V_A)_{x/2}\}(Zn_{1/3}Sb_{(2+x)/3})O_3 \quad (2)$$

The ratio c/b of the Sb amount c to the Zn amount b is 2.125 or more and 3.000 or less. In a case where the ratio c/b falls within this range, the electric-field-induced strain is large, and sintering property is good. In a case where the ratio c/b is less than this range, the electric-field-induced strain becomes small, and the durability with respect to the electric field having the direction opposite to the polarization direction is reduced. In a case where the ratio c/b is more than this range, the sintering property is deteriorated.

A Pb amount a is 0.985 or more and 0.998 or less. The deficient amount Pb required for the charge compensation is determined by an excessive amount of Sb. However, the Pb amount affects the sintering property. In a case where the Pb amount a falls within this range, the charge compensation is substantially appropriately performed, and the sintering property is good.

(Composition in the Vicinity of MPB)

The composition of the piezoelectric/electrostrictive ceramics can be brought close to the MPB. In the case where the composition of the piezoelectric/electrostrictive ceramics is close to the MPB, the electric-field-induced strain becomes large.

A Zr amount d is 0.460 or more and 0.510 or less. In a case where the Zr amount d falls within this range, the composition of the piezoelectric/electrostrictive ceramics is close to the MPB, and the electric-field-induced strain becomes large. In a case where the Zr amount is less than or more than this range, the composition of the piezoelectric/electrostrictive ceramics is away from the MPB, and the electric-field-induced strain becomes small.

(Method for Manufacturing Piezoelectric/Electrostrictive Ceramics)

Figure 2:
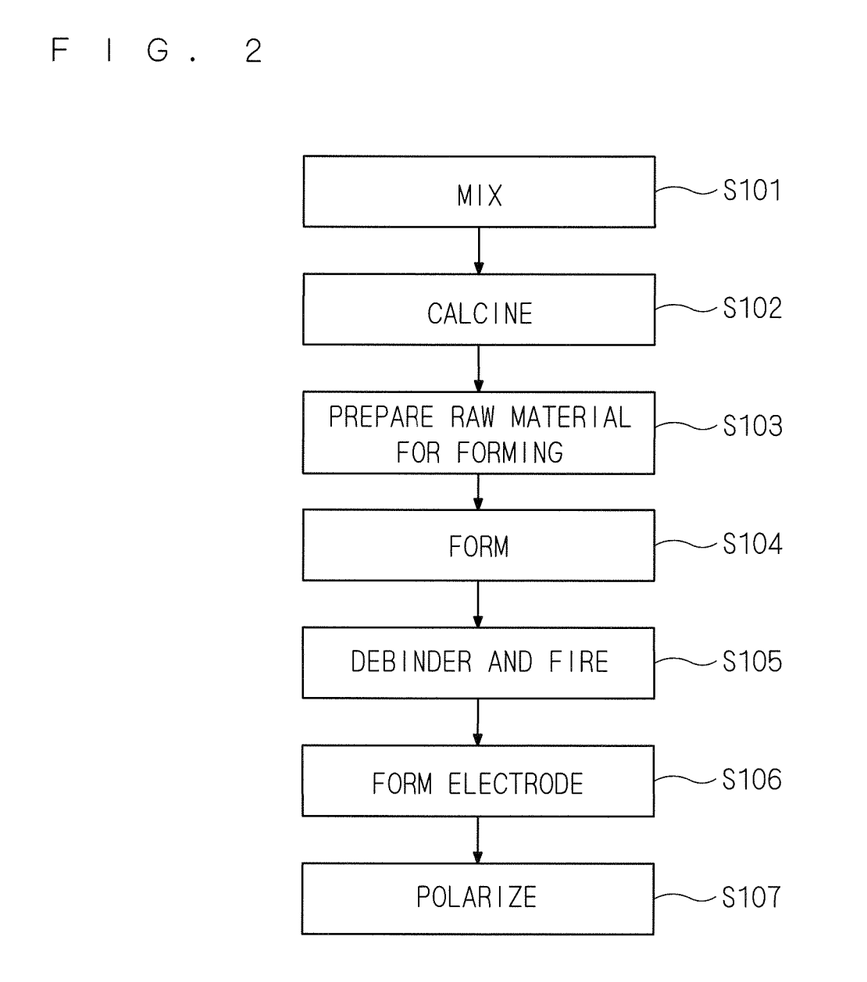
FIG. 2 is a flowchart showing a method for manufacturing a piezoelectric/electrostrictive ceramics according to a first embodiment.

FIG. 2 is a flowchart showing a method for manufacturing the piezoelectric/electrostrictive ceramics of the first embodiment.

In order to obtain the above composition, powders of starting raw materials of the constituent elements (Pb, Zr, Ti, Zn, Sb, and the like) are mixed, whereby a mixture of the powders of the starting raw materials is obtained (step S101).

The powders of the starting raw materials are mixed by a wet process. For example, the powders of the starting raw materials are mixed by a ball mill. The powders of the starting raw materials may also be mixed by a dry process.

The starting raw materials are each an oxide or a precursor of the oxide. The precursor of the oxide includes carbonate, tartrate, oxalate, and the like. The precursor of the oxide is eventually changed to the oxide. For example, the precursor of the oxide is changed to the oxide in a calcination step. The oxide is typically a simple oxide, but it may be a composite oxide such as columbite.

After the mixture of the powders of the starting raw materials is obtained, the mixture of the powders of the starting raw materials is calcined (step S102). The powders of the starting raw materials are reacted, whereby a powder of the calcined raw material is synthesized.

A calcination temperature is desirably 800° C. or higher and 950° C. or lower. However, the calcination temperature does not fall within this range in some cases.

After the calcination, the powder of the calcined raw material may be ground or classified, and a grain diameter and a specific surface area may be adjusted. After the calcination, the powder of the calcined raw material may be subjected to a granulation treatment, and a shape and a grain diameter of a secondary particle may be adjusted. For example, the powder of the calcined raw material may be subjected to spray drying. The powder of the calcined raw material may be further subjected to a heat treatment.

In a case where the accessory component is added to the main component, the powders of the starting raw materials of the constituent elements of the main component and the accessory component may be mixed before the calcination, or the powders of the starting raw materials of the constituent elements of the main component may be mixed before the calcination, and the powder of the starting raw material of the constituent element of the accessory component and the powder of the calcined raw material may be mixed after the calcination.

After the powder of the calcined raw material is synthesized, a raw material for forming is prepared (step S103). The raw material for forming takes a form of powder, slurry, paste, or the like depending on a forming method. A binder is desirably mixed in the raw material for forming.

After the raw material for forming is obtained, the raw material for forming is subjected to forming, whereby a formed body is obtained (step S104). The raw material for forming is subjected to forming by pressure molding, tape casting, casting, extrusion molding, injection molding, gel casting, or the like. In a case where the raw material for forming is subjected to forming by the tape casting, a green sheet is obtained. Two or more green sheets may be laminated and then bonded by pressure. In this case, a board-shaped formed body is obtained.

After the formed body is obtained, the formed body is debindered and fired, whereby a sintered body is obtained (step S105). The debindering and the firing are continuously performed. The debindering and the firing may also be separately performed.

A firing temperature is desirably 1000° C. or higher and 1250° C. or lower. However, the firing temperature does not fall within this range in some cases.

After the firing, the sintered body may be processed. For example, the sintered body may be cut, ground, polished, or the like.

After the sintered body is obtained, an electrode is formed on the sintered body, and a composite body of the sintered body and the electrode is obtained (step S106). The electrode is formed on the sintered body by vapor deposition, sputtering, baking, plating, or the like.

The electrode includes a conductive component. The conductive component is desirably silver (Ag), copper (Cu), palladium (Pd), platinum (Pt), gold (Au), aluminum (Al), or the like. The conductive component may be an alloy containing these metals as main components.

Before the firing, an electrode material film may be formed on the formed body and the formed body and the electrode material film may be co-fired. The electrode material film is changed to the electrode by being co-fired. The electrode material film may be embedded inside the formed body, and as a result the electrode may be embedded inside the sintered body.

After the electrode is formed, the sintered body is polarized (step S107).

The composite body may be processed after the firing or after the polarizing. For example, the composite body may be subjected to a dividing process to be cut and separated to individual elements.

Second Embodiment

A second embodiment relates to a displacement generating device.

Figure 3:
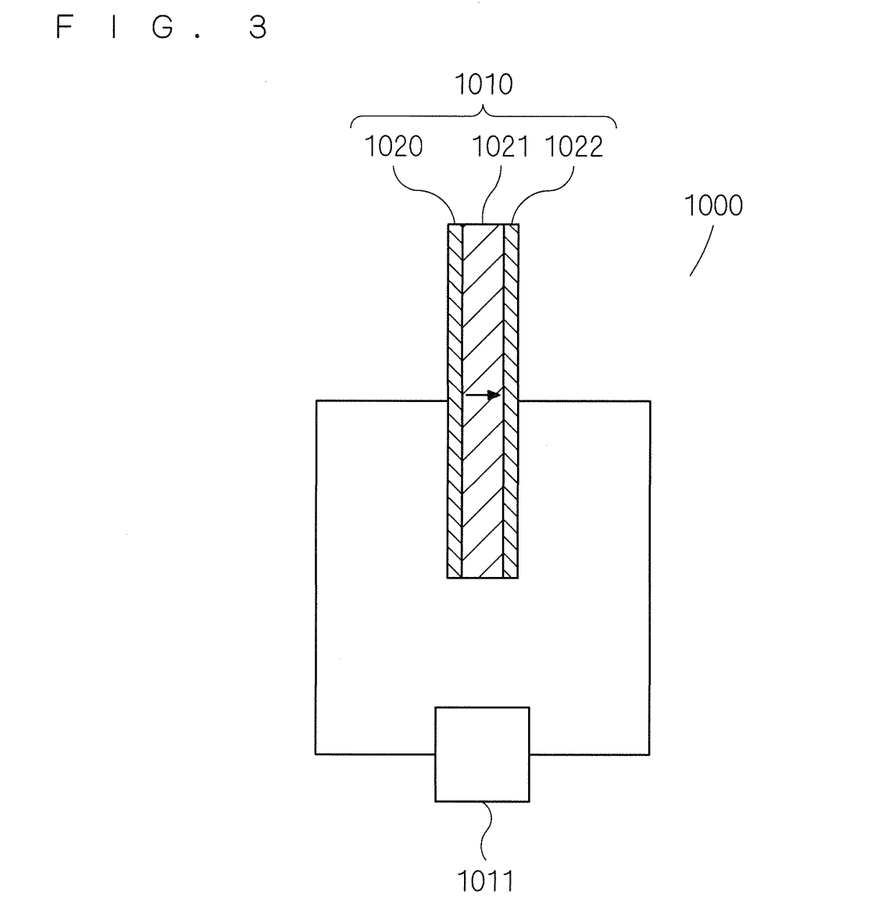
FIG. 3 is a schematic view of a displacement generating device according to a second embodiment.

FIG. 3 is a schematic view showing the displacement generating device according to the second embodiment.

As shown in FIG. 3, a displacement generating device 1000 of the second embodiment includes an actuator 1010 and a drive circuit 1011. The actuator 1010 includes a first electrode 1020, a piezoelectric/electrostrictive body 1021, and a second electrode 1022.

The piezoelectric/electrostrictive body 1021 is made of the piezoelectric/electrostrictive ceramics of the first embodiment. The first electrode 1020 and the second electrode 1022 are opposed across the piezoelectric/electrostrictive body 1021. A polarization direction of the piezoelectric/electrostrictive body 1021 is a direction from the first electrode 1020 toward the second electrode 1022.

When the drive circuit 1011 applies a drive signal between the first electrode 1020 and the second electrode 1022, an electric field is applied to the piezoelectric/electrostrictive body 1021. When the electric field is applied to the piezoelectric/electrostrictive body 1021, the piezoelectric/electrostrictive body 1021 expands or contracts, and displacement is generated. The expansion or contraction in a direction parallel to the electric field may be used, or expansion or contraction in a direction vertical to the electric field may be used.

The drive signal may be an AC voltage or a DC voltage. In the case where the drive signal is the DC voltage, the first electrode 1020 can be a positive electrode and the second electrode 1022 can be a negative electrode, or the first electrode 1020 can be the negative electrode and the second electrode 1022 can be the positive electrode.

In the case where the drive signal is the DC voltage, and the first electrode 1020 is the positive electrode and the second electrode 1022 is the negative electrode, the electric field having the same direction as the polarization direction is applied to the piezoelectric/electrostrictive body 1021. In the case where the drive signal is the DC voltage, and the first electrode 1020 is the negative electrode and the second electrode 1022 is the positive electrode, the electric field having a direction opposite to the polarization direction is applied to the piezoelectric/electrostrictive body 1021. In the case where the drive signal is the AC voltage, the electric field having the same direction as the polarization direction and the electric field having the direction opposite to the polarization direction are alternately applied to the piezoelectric/electrostrictive body 1021.

The piezoelectric/electrostrictive ceramics of the first embodiment has high durability with respect to the electric field having the direction opposite to the polarization direction. Therefore, in the case where the piezoelectric/electrostrictive body 1021 is made of the piezoelectric/electrostrictive ceramics of the first embodiment, the electric-field-induced strain is not likely to become smaller with time even in the case where the drive signal is the AC voltage, or in the case where the drive signal is the DC voltage and the first electrode 1020 is the negative electrode and the second electrode 1022 is the positive electrode. Therefore, it is possible to obtain the displacement generating device 1000 which can generate large displacement, use the electric-field-induced strain provided when the electric field having the direction opposite to the polarization direction is applied, and have high durability.

A structure of the actuator 1010 is varied depending on purposes. A shape of the piezoelectric/electrostrictive body 1021 may be any one of a plate, film, rod, ring, lump, and the like. The actuator 1010 may have a multilayer structure in which many piezoelectric/electrostrictive bodies and electrodes are alternately laminated. The actuator 1010 may be bonded to a plate to form a unimorph. In the case where the unimorph is formed, the unimorph is bent when the piezoelectric/electrostrictive body 1021 expands or contracts.

Third Embodiment

A third embodiment relates to a displacement generating device.

Figure 4:
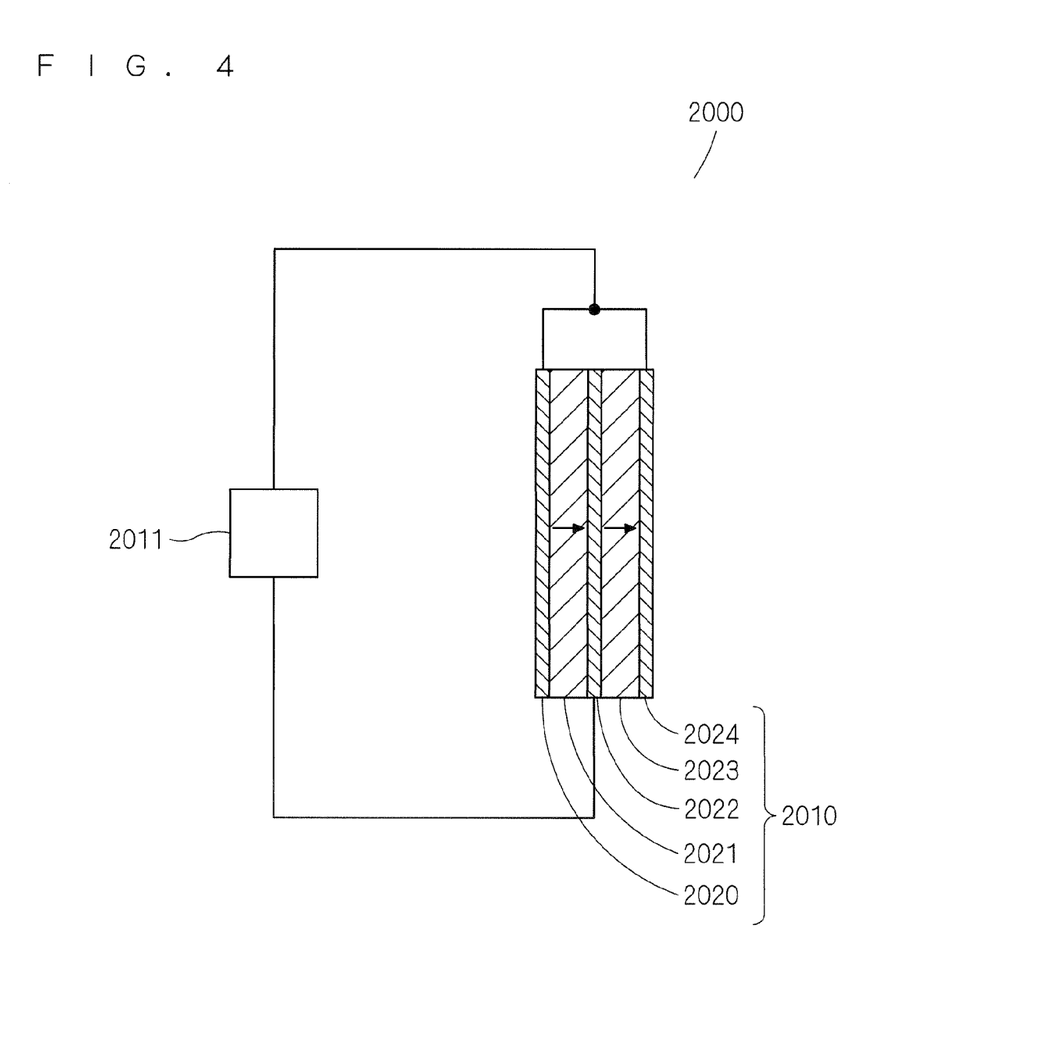
FIG. 4 is a schematic view of a displacement generating device according to a third embodiment.

FIG. 4 is a schematic view showing the displacement generating device of the third embodiment.

As shown in FIG. 4, a displacement generating device 2000 of the third embodiment includes an actuator 2010 and a drive circuit 2011. The actuator 2010 includes a first electrode 2020, a first piezoelectric/electrostrictive body 2021, a second electrode 2022, a second piezoelectric/electrostrictive body 2023, and a third electrode 2024.

The actuator 2010 is a bimorph type.

The first piezoelectric/electrostrictive body 2021 and the second piezoelectric/electrostrictive body 2023 are made of the piezoelectric/electrostrictive ceramics of the first embodiment. The first electrode 2020 and the second electrode 2022 are opposed across the first piezoelectric/electrostrictive body 2021. The second electrode 2022 and the third electrode 2024 are opposed across the second piezoelectric/electrostrictive body 2023. A polarization direction of the first piezoelectric/electrostrictive body 2021 is a direction from the first electrode 2020 toward the second electrode 2022. A polarization direction of the second piezoelectric/electrostrictive body 2023 is a direction from the second electrode 2022 toward the third electrode 2024.

The first electrode 2020 and the third electrode 2024 have the same potential, and each serve as one drive electrode. The second electrode 2022 serves as the other drive electrode.

When the drive circuit 2011 applies a drive signal between the one drive electrode and the other drive electrode, an electric field is applied to the first piezoelectric/electrostrictive body 2021 and the second piezoelectric/electrostrictive body 2023. When the electric field is applied to the first piezoelectric/electrostrictive body 2021 and the second piezoelectric/electrostrictive body 2023, one of the first piezoelectric/electrostrictive body 2021 and the second piezoelectric/electrostrictive body 2023 expands, and the other of the first piezoelectric/electrostrictive body 2021 and the second piezoelectric/electrostrictive body 2023 contracts, so that the actuator 2010 is bent, and displacement is generated.

The drive signal may be a DC voltage or an AC voltage. In the case where the drive signal is the DC voltage, the one drive electrode can be a positive electrode and the other drive electrode can be a negative electrode, or the one drive electrode can be the negative electrode and the other drive electrode can be the positive electrode.

Whether the drive signal is the DC voltage or the AC voltage, an electric field having the same direction as the polarization direction is applied to the one of the first piezoelectric/electrostrictive body 2021 and the second piezoelectric/electrostrictive body 2023, and an electric field having a direction opposite to the polarization direction is applied to the other of the first piezoelectric/electrostrictive body 2021 and the second piezoelectric/electrostrictive body 2023.

The piezoelectric/electrostrictive ceramics of the first embodiment has high durability with respect to the electric field having the direction opposite to the polarization direction. Therefore, in the case where the first piezoelectric/electrostrictive body 2021 and the second piezoelectric/electrostrictive body 2023 are made of the piezoelectric/electrostrictive ceramics of the first embodiment, the electric-field-induced strain is not likely to become smaller with time. That is, in the case where the first piezoelectric/electrostrictive body 2021 and the second piezoelectric/electrostrictive body 2023 are made of the piezoelectric/electrostrictive ceramics of the first embodiment, it is possible to provide the displacement generating device 2000 which can generate large displacement, use the electric-field-induced strain provided when the electric field having the direction opposite to the polarization direction is applied, and have high durability.

A structure of the actuator 2010 is varied depending on purposes. The actuator 2010 may have a multilayer structure in which many piezoelectric/electrostrictive body films and electrode films are alternately laminated. Examples (Samples 1 to 18)

Simple oxides of constituent elements were used as starting raw materials. Powders of the starting raw materials were mixed so that a composition in Table 2 was obtained, whereby a mixture of the powders of the starting raw materials was obtained. The mixture of the powders of the starting raw materials was calcined at 850° C., and the powder of the calcined raw material was synthesized. The powder of the calcined raw material, a binder, and a dispersing agent were dispersed in water, whereby slurry was obtained. The slurry was subjected to tape casting by a doctor blade method, whereby a green sheet was obtained. The green sheets were laminated, whereby a board-shaped formed body was obtained. The board-shaped formed body was fired at 1200° C., and a board-shaped sintered body having a board thickness of 0.4 mm was obtained. The board-shaped sintered body was processed into a piezoelectric/electrostrictive body having a rectangular plate shape of 3.0 mm×1.0 mm×0.3 mm. Electrodes made of Ag were formed on an upper surface and a lower surface of the piezoelectric/electrostrictive body, whereby a composite body of the piezoelectric/electrostrictive body and the electrodes was obtained. The composite body of the piezoelectric/electrostrictive body and the electrodes were immersed in a silicone oil, and a polarization treatment was performed under conditions of 80° C. and 3000 V/mm, whereby a piezoelectric/electrostrictive element (piezoelectric/electrostrictive actuator) was obtained.

TABLE 2

Composition, $d_{31}$, and decreasing rate of $d_{31}$

| Sample | $Pb_a\{Zn_bM_c(Zr_dTi_{1-d})_{1-b-c}\}O_3$ | | | | | | $d_{31}$ (pm/V) | Decreasing rate of $d_{31}$ |
|---|---|---|---|---|---|---|---|---|
| | a | b | M | c | d | c/d | | |
| 1 | 0.998 | 0.010 | Sb | 0.025 | 0.510 | 2.500 | 196 | 16% |
| 2 | 0.996 | 0.010 | Sb | 0.030 | 0.510 | 3.000 | 204 | 14% |
| 3* | 0.991 | 0.010 | Sb | 0.040 | 0.514 | 4.000 | Lack of sintering | Lack of sintering |
| 4* | 1.000 | 0.020 | Sb | 0.040 | 0.500 | 2.000 | 228 | 27% |
| 5 | 0.998 | 0.020 | Sb | 0.045 | 0.500 | 2.250 | 239 | 13% |
| 6 | 0.996 | 0.020 | Sb | 0.050 | 0.503 | 2.500 | 237 | 11% |
| 7 | 0.996 | 0.020 | Sb | 0.050 | 0.499 | 2.500 | 261 | 8% |
| 8 | 0.996 | 0.020 | Sb | 0.050 | 0.495 | 2.500 | 241 | 5% |
| 9 | 0.994 | 0.020 | Sb | 0.055 | 0.496 | 2.750 | 235 | 6% |
| 10* | 0.994 | 0.020 | Nb | 0.055 | 0.496 | 2.750 | 204 | 27% |
| 11 | 0.998 | 0.030 | Sb | 0.065 | 0.489 | 2.167 | 285 | 16% |
| 12 | 0.996 | 0.030 | Sb | 0.070 | 0.489 | 2.333 | 290 | 15% |
| 13 | 0.991 | 0.030 | Sb | 0.080 | 0.489 | 2.667 | 275 | 14% |
| 14 | 0.985 | 0.030 | Sb | 0.090 | 0.480 | 3.000 | 244 | 11% |
| 15* | 0.985 | 0.030 | Nb | 0.090 | 0.480 | 3.000 | 227 | 32% |
| 16 | 0.998 | 0.040 | Sb | 0.085 | 0.460 | 2.125 | 275 | 17% |
| 17 | 0.996 | 0.040 | Sb | 0.090 | 0.476 | 2.250 | 336 | 14% |
| 18* | 0.996 | 0.050 | Sb | 0.110 | 0.463 | 2.200 | 357 | 42% |

Displacement provided when the piezoelectric/electrostrictive element was driven at 100 V/mm was measured by a laser Doppler displacement meter. A piezoelectric constant $d_{31}$ was calculated from the measured result. The results are shown in Table 2.

A sine wave having a frequency of 10 kHz in which a voltage fluctuates in a range of −150±150 V/mm under an environment of 150° C. was applied to the piezoelectric/electrostrictive element for 100 hours. Then, the displacement provided when the piezoelectric/electrostrictive element was driven at 100 V/mm was measured again by the laser Doppler displacement meter. The piezoelectric constant $d_{31}$ was calculated from the measured result. A decreasing rate of the piezoelectric constant $d_{31}$ before and after the sine wave was applied was calculated. The results are shown in Table 2. The piezoelectric constant $d_{31}$ is an index of a size of the electric-field-induced strain. The decreasing rate of the piezoelectric constant $d_{31}$ is an index of poor durability with respect to the electric field having the direction opposite to the polarization direction.

As for the samples 1, 2, 5 to 9, 11 to 14, 16, and 17 in which each composition is expressed by a general formula $Pb_a\{Zn_bSb_c(Zr_dTi_{1-d})_{1-b-c}\}O_3$ in which a, b, c, and d satisfy 0.985≤a≤0.998, 0.010≤b≤0.040, 0.025≤c≤0.090, 0.460≤d≤0.510, and 2.125≤c/b≤3.000, the piezoelectric constant $d_{31}$ was great, and the decreasing rate of the piezoelectric constant $d_{31}$ was low.

Meanwhile, as for the sample 3 in which the ratio c/b is more than 3.000, sintering property deteriorated, and the piezoelectric constant $d_{31}$ could not be measured. As for the sample 4 in which the Pb amount a is more than 0.998 and the ratio c/b is less than 2.125, the decreasing rate of the piezoelectric constant $d_{31}$ was high. The sample 4 has a stoichiometric composition. As for the samples 10 and 15 in which the third component is Pb(Zn,Nb)O₃, the decreasing rate of the piezoelectric constant $d_{31}$ was high. As for the sample 18 in which the Zn amount b is more than 0.040 and the Sb amount c is more than 0.090, the decreasing rate of the piezoelectric constant $d_{31}$ was high.

(Samples 19, 20, and 22 to 25)

Piezoelectric/electrostrictive elements were obtained in the same manner as in the samples 1 to 18 except that the powders of the starting raw materials were mixed so that a composition in Table 3 was obtained. In addition, the piezoelectric constant $d_{31}$, and the decreasing rate of the piezoelectric constant $d_{31}$ were calculated in the same manner as in the samples 1 to 18. The results are shown in Table 3.

TABLE 3

Composition, $d_{31}$, and decreasing rate of $d_{31}$

| Sample | $Pb_a\{Zn_bM_c(Zr_dTi_{1-d})_{1-b-c}\}O_3$ | | | | | | Additive element | Timing of addition | Additive amount (parts by weight) | $d_{31}$ (pm/V) | Decreasing rate of $d_{31}$ |
|---|---|---|---|---|---|---|---|---|---|---|---|
| | a | b | M | c | d | c/d | | | | | |
| 19 | 0.998 | 0.020 | Sb | 0.055 | 0.496 | 2.750 | Mn | Before calcination | 0.020 | 231 | 5% |
| 20 | 0.998 | 0.020 | Sb | 0.055 | 0.496 | 2.750 | Mn | Before calcination | 0.050 | 220 | 2% |
| 21 | 0.998 | 0.020 | Sb | 0.055 | 0.496 | 2.750 | Mn | After calcination | 0.050 | 223 | 3% |
| 22 | 0.998 | 0.020 | Sb | 0.055 | 0.496 | 2.750 | Mn | Before calcination | 0.100 | 198 | 1% |
| 23 | 0.996 | 0.030 | Sb | 0.070 | 0.489 | 2.333 | Mn | Before calcination | 0.050 | 284 | 6% |
| 24 | 0.998 | 0.020 | Sb | 0.055 | 0.496 | 2.750 | Cr | Before calcination | 0.150 | 211 | 3% |
| 25 | 0.998 | 0.020 | Sb | 0.055 | 0.496 | 2.750 | Dy | Before calcination | 0.300 | 224 | 5% |

As for the samples 19, 20, 22, and 23 in which an additive amount of Mn relative to 100 parts by weight of the main component is 0.020 parts by weight or more and 0.100 parts by weight or less in terms of MnO, the piezoelectric constant $d_{31}$ was great, and the decreasing rate of the piezoelectric constant $d_{31}$ was extremely low. Also, as for the sample 24 in which an additive amount of Cr relative to 100 parts by weight of the main component is 0.150 parts by weight in terms of $Cr_2O_3$, the piezoelectric constant $d_{31}$ was great, and the decreasing rate of the piezoelectric constant $d_{31}$ was extremely low. Also, as for the sample 25 in which an additive amount of Dy relative to 100 parts by weight of the main component is 0.300 parts by weight in terms of $Dy_2O_3$, the piezoelectric constant $d_{31}$ was great, and the decreasing rate of the piezoelectric constant $d_{31}$ was extremely low.

(Sample 21)

A piezoelectric/electrostrictive element was obtained in the same manner as in the samples 1 to 18 except that the 5 powders of the starting raw materials were mixed so that the composition in Table 3 was obtained, the powders of the starting raw materials except for Mn were mixed before the calcination, and the powder of the starting raw material of Mn and powder of the calcined raw material were mixed after the calcination. In addition, the piezoelectric constant $d_{31}$, and the decreasing rate of the piezoelectric constant $d_{31}$ were calculated in the same manner as in the samples 1 to 18. The results are shown in Table 3.

Also, as for the sample 21 in which the mixing was performed after the calcination, the piezoelectric constant $d_{31}$ was great, and the decreasing rate of the piezoelectric constant $d_{31}$ was extremely low, as in the sample 20 where the mixing was performed before the calcination process.

The present invention has been shown and described in detail, but the above description is illustrative and not limited in all aspects. Therefore, it is understood that numerous modifications and variations can be made without departing the scope of the present invention.

DESCRIPTION OF REFERENCE SIGNS

1000 Displacement generating device
1010 Actuator
1011 Drive circuit
1020 First electrode
1021 Piezoelectric/electrostrictive body
1022 Second electrode
2000 Displacement generating device
2010 Actuator
2011 Drive circuit
2020 First electrode
2021 First piezoelectric/electrostrictive body
2022 Second electrode
2023 Second piezoelectric/electrostrictive body
2024 Third electrode

The invention claimed is:

1. A piezoelectric/electrostrictive ceramics composition represented by a general formula $Pb_a\{Zn_bSb_c(Zr_dTi_{1-d})_{1-b-c}\}O_3$ in which a, b, c, and d satisfy $0.985 \leq a \leq 0.998$, $0.010 \leq b \leq 0.040$, $0.025 \leq c \leq 0.090$, $0.460 \leq d \leq 0.510$, and $2.125 \leq c/b \leq 3.000$.

2. A displacement generating device comprising:
an actuator including a first electrode, a piezoelectric/electrostrictive body, and a second electrode, said piezoelectric/electrostrictive body being made of the piezoelectric/electrostrictive ceramics composition according to claim 1, said first electrode and said second electrode being opposed across said piezoelectric/electrostrictive body, and a polarization direction of said piezoelectric/electrostrictive body being a direction from said first electrode toward said second electrode; and
a drive circuit for applying a drive signal between said first electrode and said second electrode, said drive signal being an AC voltage, or a DC voltage in which said first electrode serves as a negative electrode and said second electrode serves as a positive electrode.

3. A displacement generating device comprising:
a bimorph-type actuator including a first electrode, a first piezoelectric/electrostrictive body, a second electrode, a second piezoelectric/electrostrictive body, and a third electrode, said first piezoelectric/electrostrictive body and said second piezoelectric/electrostrictive body being made of the piezoelectric/electrostrictive ceramics composition according to claim 1, said first electrode and said second electrode being opposed across said first piezoelectric/electrostrictive body, said second electrode and said third electrode being opposed across said second piezoelectric/electrostrictive body, a polarization direction of said first piezoelectric/electrostrictive body being a direction from said first electrode toward said second electrode, and a polarization direction of said second piezoelectric/electrostrictive body being a direction from said second electrode toward said third electrode; and
a drive circuit for applying a drive signal between one drive electrode and another drive electrode, said first electrode and said third electrode each serving as said one drive electrode, and said second electrode serving as said another drive electrode.

4. A piezoelectric/electrostrictive ceramics composition provided by adding an accessory component containing at least one element selected from the group consisting of Mn, Cr, Fe, and a rare-earth element R to a main component represented by a general formula $Pb_a\{Zn_bSb_c(Zr_dTi_{1-d})_{1-b-c}\}O_3$ wherein a, b, c, and d satisfy $0.985 \leq a \leq 0.998$, $0.010 \leq b \leq 0.040$, $0.025 \leq c \leq 0.090$, $0.460 \leq d \leq 0.510$, and $2.125 \leq c/b \leq 3.000$, wherein
in a case where an additive amount of Mn is expressed in terms of MnO, an additive amount of Cr is expressed in terms of $Cr_2O_3$, an additive amount of Fe is expressed in terms of $Fe_2O_3$, and an additive amount of the rare-earth element R is expressed in terms of $R_2O_3$, an additive amount of the at least one element relative to 100 parts by weight of the main component is 0.3 parts by weight or less.

5. A displacement generating device comprising:
an actuator including a first electrode, a piezoelectric/electrostrictive body, and a second electrode, said piezoelectric/electrostrictive body being made of the piezoelectric/electrostrictive ceramics composition according to claim 4, said first electrode and said second electrode being opposed across said piezoelectric/electrostrictive body, and a polarization direction of said piezoelectric/electrostrictive body being a direction from said first electrode toward said second electrode; and
a drive circuit for applying a drive signal between said first electrode and said second electrode, said drive signal being an AC voltage, or a DC voltage in which said first electrode serves as a negative electrode and said second electrode serves as a positive electrode.

6. A displacement generating device comprising:
a bimorph-type actuator including a first electrode, a first piezoelectric/electrostrictive body, a second electrode, a second piezoelectric/electrostrictive body, and a third electrode, said first piezoelectric/electrostrictive body and said second piezoelectric/electrostrictive body being made of the piezoelectric/electrostrictive ceramics composition according to claim 4, said first electrode and said second electrode being opposed across said first piezoelectric/electrostrictive body, said second electrode and said third electrode being opposed across said second piezoelectric/electrostrictive body, a polarization direction of said first piezoelectric/electrostrictive body being a direction from said first electrode toward said second electrode, and a polarization direction of said second piezoelectric/electrostrictive body being a direction from said second electrode toward said third electrode; and a drive circuit for applying a drive signal between one drive electrode and another drive electrode, said first electrode and said third electrode each serving as said one drive electrode, and said second electrode serving as said another drive electrode.

* * * * *